(12) United States Patent
Heyne et al.

(10) Patent No.: US 7,629,820 B2
(45) Date of Patent: Dec. 8, 2009

(54) DELAY CIRCUIT

(75) Inventors: Patrick Heyne, Munich (DE); Per Anders Johansson, Unterhaching (DE)

(73) Assignee: Qimonda AG, Munich (DE)

( * ) Notice: Subject to any disclaimer, the term of this patent is extended or adjusted under 35 U.S.C. 154(b) by 9 days.

(21) Appl. No.: 11/860,171

(22) Filed: Sep. 24, 2007

(65) Prior Publication Data

US 2008/0074159 A1    Mar. 27, 2008

(30) Foreign Application Priority Data

Sep. 22, 2006    (DE) .................. 10 2006 044 854

(51) Int. Cl.
*H03L 7/06*    (2006.01)
(52) U.S. Cl. .................. 327/158; 327/156; 327/149
(58) Field of Classification Search .......... 327/147–159
See application file for complete search history.

(56) References Cited

U.S. PATENT DOCUMENTS

| | | | |
|---|---|---|---|
| 5,796,673 A * | 8/1998 | Foss et al. ................ | 365/233.1 |
| 6,917,229 B2 | 7/2005 | Cho | |
| 7,137,022 B2 * | 11/2006 | Ishikawa .................... | 713/400 |
| 7,391,244 B2 * | 6/2008 | Morche ....................... | 327/158 |
| 2003/0001636 A1 | 1/2003 | Partsch et al. | |
| 2004/0070431 A1 | 4/2004 | Henrickson | |
| 2005/0141334 A1 | 6/2005 | Jeong | |

OTHER PUBLICATIONS

Pavel Petkov, et al., "An Infinite-Skew Tolerant Delay Locked Loop," Circuits and Systems, 2006. ISCAS 2006. Proceedings. 2006 IEEE International Symposium on May 21-24, 2006.

* cited by examiner

*Primary Examiner*—Dinh T. Le
(74) *Attorney, Agent, or Firm*—Edell, Shapiro & Finnan, LLC

(57) ABSTRACT

A delay circuit includes a delay device, to which an input signal is supplied. A first phase-shifted signal can be generated by the delay device, which is delayed by a first delay time with respect to the input signal, and a second phase-shifted signal can be generated, which is delayed by a second delay time with respect to the input signal. The delay device is configured such that the first and second phase-shifted signal can be generated in inverted fashion with respect to one another at an output terminal of the delay device after a delay of the input signal by a delay time.

13 Claims, 7 Drawing Sheets

DELAY CIRCUIT

CROSS REFERENCE TO RELATED APPLICATIONS

This application claims priority under 35 U.S.C. §119 to Application No. DE 102006044854.5 filed on Sep. 22, 2007, entitled "Delay Circuit," the entire contents of which are hereby incorporated by reference.

BACKGROUND

In integrated circuits operated synchronously with an input signal applied to the circuit externally, for example, with an externally applied clock signal, an internal signal derived from the external input signal is generally generated. Control operations are controlled synchronously with the internal signal internally within the circuit. In this case, the internal signal must be generated clock-synchronously with the external input signal. For synchronizing the external input signal with an internal signal, it is possible to use, for example, a delay circuit shown in FIG. 1, a so-called DLL (delay lock loop) circuit. The DLL circuit generates an output signal that is derived from an input signal and behaves phase-synchronously with respect to the latter.

FIG. 1 shows an integrated circuit comprising a delay circuit of this type. An input signal IN, which can be a clock signal, for example, is applied to an input terminal E0 of the integrated circuit. The input signal IN is amplified by a receiving circuit 1 and fed as a signal CK to an input terminal E10 of a delay circuit. The input terminal E10 is connected to a controllable delay device 2. After a delay of the signal CK in the controllable delay device, a signal P that is phase-shifted with respect to the signal CK is generated at an output terminal A10. The phase-shifted signal P is amplified via a driver circuit 3 and output as signal OUT at an output terminal A0 of the integrated circuit. The input signal IN experiences a respective delay τ1 and τ3 in the receiving circuit 1 and the driver circuit 3. The delay τ2, with which the input signal CK is delayed in the controllable delay device 2, can be set via a control signal CTRL.

In order that the output signal OUT is generated phase-synchronously with respect to the input signal IN, the delay time τ2 of the controllable delay device 2 must be set such that the input signal IN experiences, in the forward path comprising the receiving circuit 1, the controllable delay device 2 and the driver circuit 3, a delay corresponding to a multiple of the clock period of the input signal IN.

For setting the delay time τ2 of the controllable delay device 2, the phase-shifted signal P is fed to a feedback circuit 4 and delayed there by a time TC, in which the delay time τ1 of the receiving circuit 1 and the delay time τ3 of the driver circuit 3 are taken into account. The signal CK generated by the receiving circuit 1 on the output side and a signal FB generated by the feedback circuit on the output side are subsequently fed to a phase detector 5. The phase detector 5 compares the phase of the signal CK with the phase of the signal FB and generates a comparison signal VS on the output side, the comparison signal being fed to a control circuit 6. Depending on the comparison signal VS, the control circuit 6 generates the control signal CTRL, which can be used to set the delay time τ2 of the controllable delay device 2. Via the control loop of the delay circuit, the delay time of the delay device 2 is in this case varied such that the phase of the signal CK matches the phase of the signal FB at the phase detector 5. In this case the circuit is in a locked state.

FIGS. 2A, 2B and 2C in each case show a schematic illustration of the delay device 2. The delay device comprises a chain of delay elements, wherein each delay element delays the input signal CK by a delay time t. Depending on the set delay time or the control signal CTRL with which the controllable delay device is driven, the phase-shifted signal P that is delayed with respect to the signal CK is tapped off downstream of a delay element of the chain and fed, in accordance with FIG. 1, to the output terminal A0 of the delay circuit.

In the case of FIG. 2A, an input signal having a frequency f0 is fed to the delay circuit. In order to generate the output signal of the delay circuit phase-synchronously with respect to the input signal, the signal CK fed to the delay device is output from the delay device in a manner delayed by a delay time t1. In order to generate the output signal phase-synchronously with respect to the input signal, the input signal can also be coupled out from the delay device after a delay time t9, since the delayed signal has the same phase, a rising edge in the example in FIG. 2A, at this instant as at the delay instant t1. The delay device 2 is generally set with the lowest delay time, the delay time t1 in the example of FIG. 2A, by the control circuit 6.

In the event of the frequency of the input signal being increased to a frequency f1, the delay time of the controllable delay device is reduced by the control loop of the DLL circuit. As is illustrated in FIG. 2B, at the increased frequency f1, the signal fed to the controllable delay device is already coupled out from the delay device after a delay time t0.

If the frequency of the input signal is increased even further to a frequency f2, however, the phase-shifted signal P with the required phase, for example, a rising edge, can no longer be coupled out earlier from the delay device since the phase-shifted signal P has already been coupled out from the delay device at the earliest possible delay instant t0 at the frequency f1. In order to generate an output signal phase-synchronously with respect to the input signal also at the higher frequency f2 of the input signal, a further controllable delay device must be provided.

In the method illustrated in FIGS. 2A to 2C, the maximum delay time tmax which can be set via the controllable delay device should be chosen such that the maximum possible delay time tmax corresponds to the period duration of the lowest possible frequency of the input signal, for example, the lowest specified frequency. Owing to the necessary length of the delay chain for synchronizing low frequencies of an input signal and the necessity of having to provide a second delay circuit at high frequencies of the input signal, a large area and a high current are required on a chip of an integrated circuit, for example on a chip of an integrated semiconductor memory.

SUMMARY

Described herein is a delay circuit via which an input signal fed to the delay circuit can be delayed such that an output signal of the delay circuit is synchronized with respect to the input signal. Furthermore, an integrated circuit memory comprising a delay circuit of this type and a method for operating a delay circuit of this type is described herein.

The delay circuit includes a delay device, to which an input signal is fed on the input side. Via the delay device, a first phase-shifted signal can be generated, which is delayed by a first delay time with respect to the input signal, and a second phase-shifted signal can be generated, which is delayed by a second delay time with respect to the input signal. The delay device is configured such that the first and second phase-shifted signals can be generated in inverted fashion with respect to one another at an output terminal of the delay device after a delay of the input signal by a delay time.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The delay circuit and method are explained in more detail below with reference to figures showing exemplary embodiments. In the accompanying drawings.

DETAILED DESCRIPTION

In accordance with one embodiment, the delay circuit comprises an input terminal for applying an input signal, a first output terminal, at which a first signal that is phase-shifted with respect to the input signal can be generated, and a second output terminal, at which a second signal that is phase-shifted with respect to the input signal can be generated. The delay circuit furthermore has a feedback circuit for generating a feedback signal that is phase-shifted with respect to an input signal of the feedback circuit, wherein optionally the first or second phase-shifted signal can be fed to the feedback circuit. Furthermore, the delay circuit comprises a first phase comparison device, to which are fed on the input side the input signal and the feedback signal for carrying out a phase comparison between the input signal and the feedback signal. Moreover, the delay circuit has a control circuit for setting a first and second delay time by which the controllable delay device delays the first and second phase-shifted signal with respect to the input signal, depending on the phase comparison carried out by the first comparison device. The controllable delay device is embodied such that the first and second phase-shifted signal can be generated in inverted fashion with respect to one another at the first and second output terminal of the controllable delay device after a delay of the input signal by a delay time.

Figure 1:
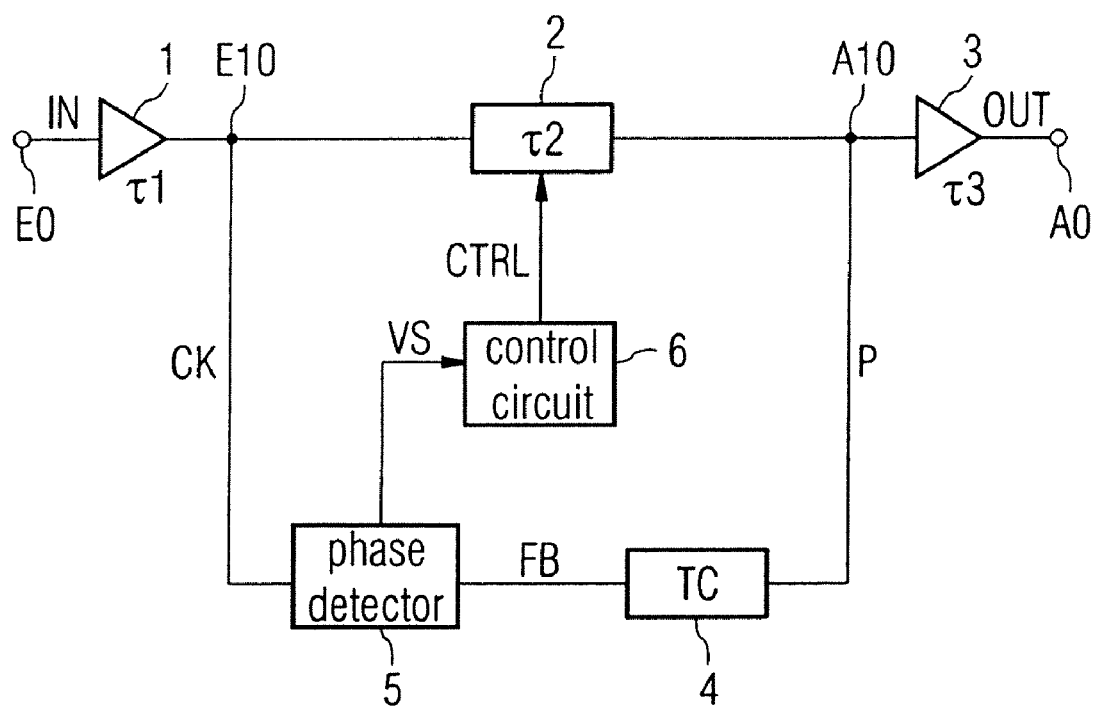
FIG. 1 illustrates an embodiment of a delay circuit configured to synchronize an output signal with an input signal.

The delay circuit according to the exemplary embodiment makes it possible to shorten the length of the series circuit comprising the delay elements. Since the first and second phase-shifted signal can be coupled out from the delay device in phase-inverted fashion with respect to one another, it suffices if the delay time that is maximally to be achieved with the series circuit comprising the delay elements corresponds to half of a period duration of the input signal having the lowest possible frequency or the lowest specified frequency in accordance with a circuit specification. In comparison with a delay circuit as indicated in FIG. 1, the length of the series circuit comprising the delay elements can thus be reduced by half.

In the following paragraphs, exemplary embodiments of the device and method are described in connection with the figures.

Figure 3:
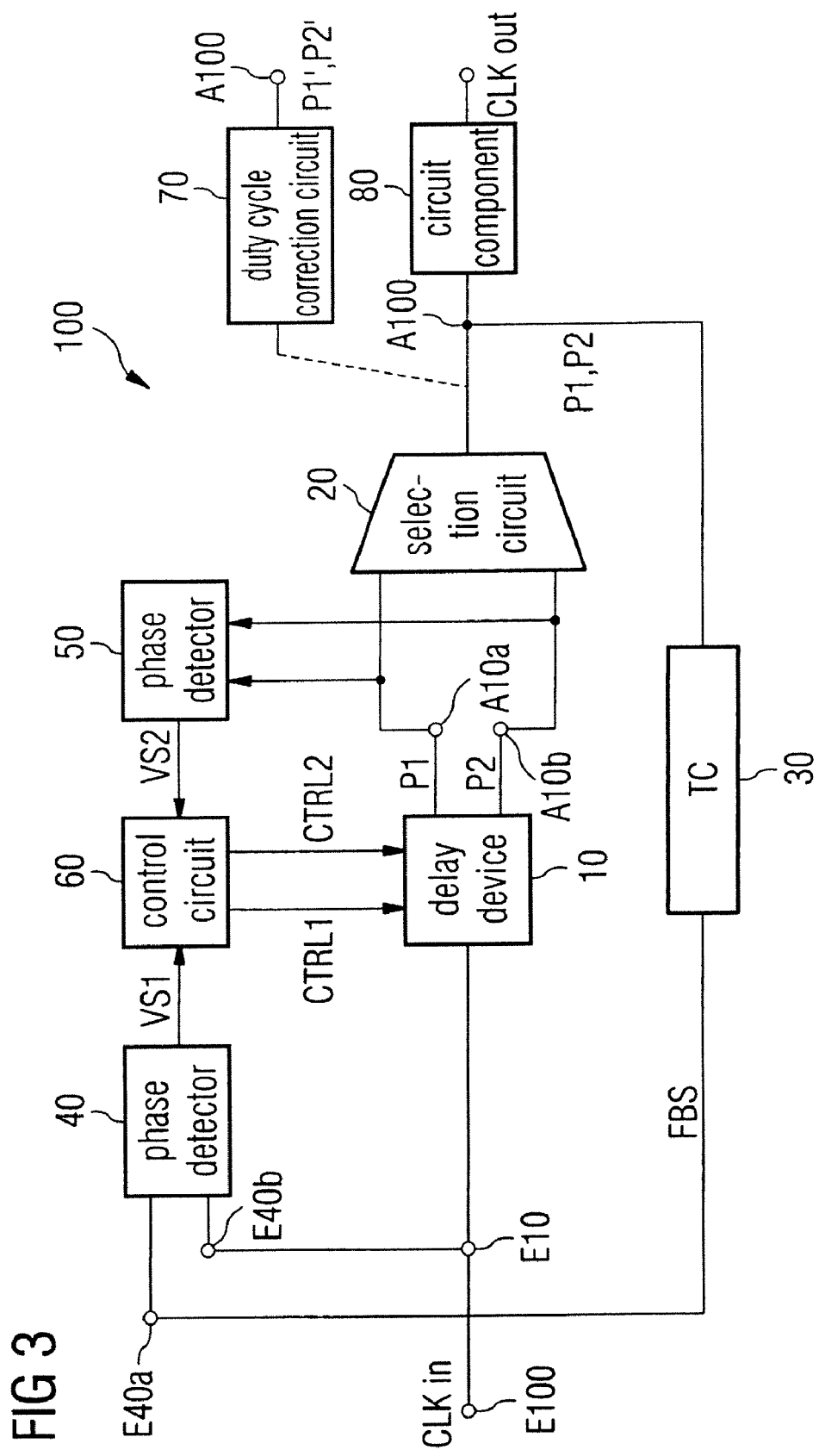
FIG. 3 illustrates an embodiment of a delay circuit configured to synchronize an output signal with an input signal.

FIG. 3 shows an embodiment of a delay circuit 100, in which an input signal CLKin is fed to an input terminal E100 of the delay circuit. The input terminal E100 of the delay circuit is connected to an input terminal E10 of a delay device 10. The delay device 10 comprises a plurality of delay elements via which the input signal CLKin can be delayed by a delay time T1. The delayed input signal is coupled out from the delay device as a signal P1 that is phase-shifted with respect to the input signal CLKin and is fed to an output terminal A10a of the delay device. Furthermore, the input signal CLKin can be delayed by a delay time T2 in the delay device and be generated as a signal P2 that is phase-shifted with respect to the input signal CLKin at an output terminal A10b of the delay device.

The phase-shifted signals P1 and P2 are fed to a selection circuit 20 on the input side. The selection circuit 20 forwards one of the phase-shifted signals P1 or P2 to an output terminal A100 of the delay circuit. In one embodiment of the delay circuit, a duty cycle correction circuit 70 is connected between an output terminal of the selection circuit and the output terminal A100 of the delay circuit, which duty cycle correction circuit can be used to match durations of a high and low level of the phase-shifted signals P1 and P2. Corrected signals P1' and P2', for example, signals having a duty cycle of 50%, can thereby be generated at the output terminal A100.

The output terminal A100 of the delay circuit is connected to an input terminal E40a of a phase detector 40 via a feedback circuit 30. The input signal CLKin is fed to an input terminal E40b of the phase detector 40. The phase detector 40 generates a comparison signal VS1 on the output side depending on a comparison of the phase of the input signal CLKin with a phase of the feedback signal FBS, the comparison signal being fed to a control circuit 60.

Furthermore, the phase-shifted signals P1 and P2 are fed to a further phase detector 50. The phase detector 50 generates a comparison signal VS2 depending on a comparison of the phase of the phase-shifted signal P1 with the phase of the phase-shifted signal P2, the comparison signal being fed to a control circuit 60. The control circuit 60 generates control signals CTRL1 and CTRL2 on the output side after evaluation of the comparison signals VS1 and VS2, the control signals being fed to the comparison device 10. The control signals CTRL1 and CTRL2 can be used to set the delay time T1 with which the phase-shifted signal P1 is delayed with respect to the input signal CLKin, and the delay time T2 with which the phase-shifted signal P2 is delayed with respect to the input signal CLKin.

The delay time with which the feedback circuit 30 delays one of the phase-shifted signals P1 or P2 fed to it on the input side corresponds to a transit time of a circuit component 80 connected downstream of the delay device, which circuit component can be embodied as a driver circuit, for example. The embodiment of the delay circuit that is illustrated in FIG. 3 makes it possible to generate an output signal CLKout at an output terminal A80 of the driver circuit phase-synchronously with respect to the input signal CLKin.

Figure 4:
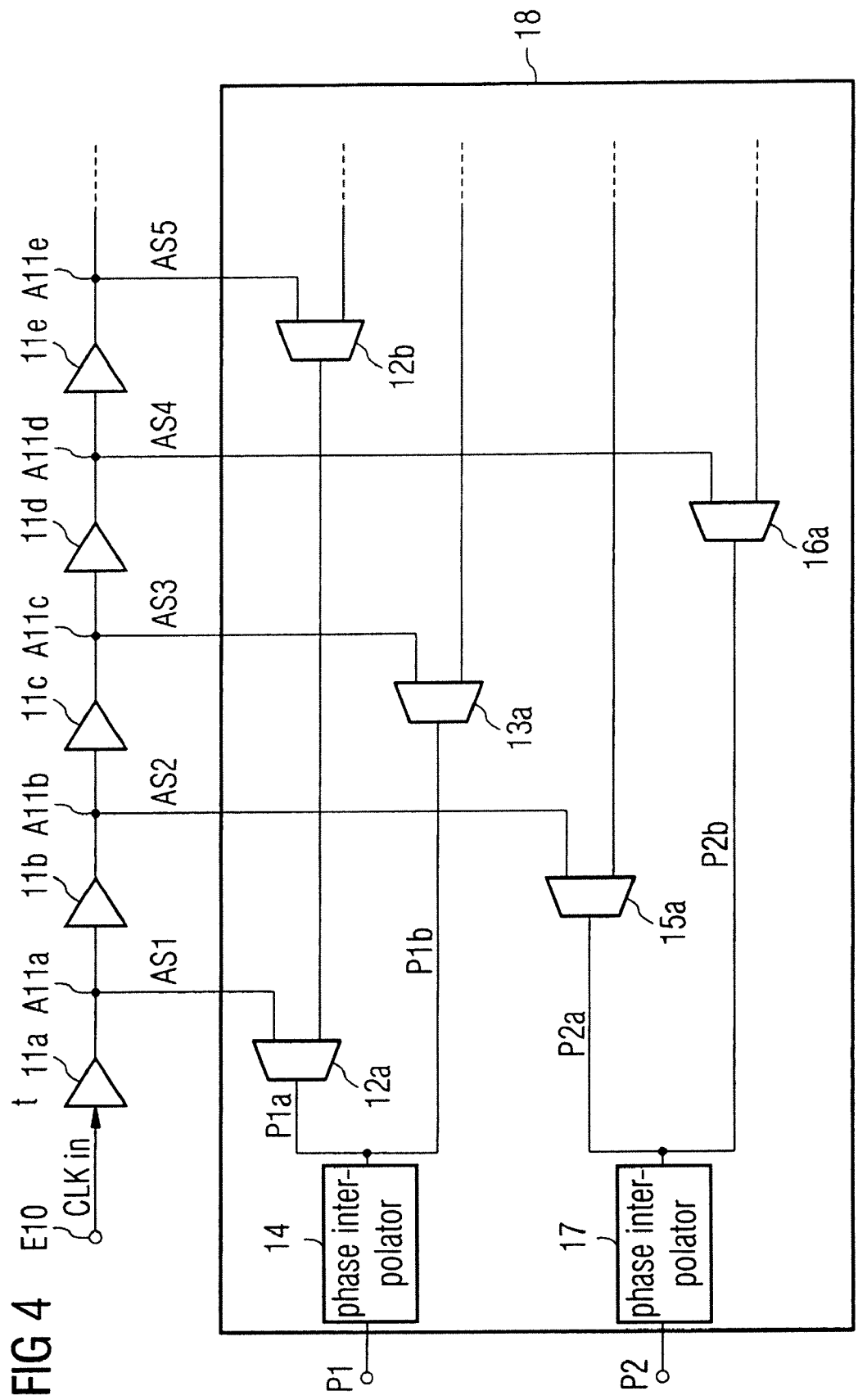
FIG. 4 illustrates an embodiment of a delay device of a delay circuit with outputs of phase-shifted signals.

FIG. 4 shows an embodiment of the delay device 10. The delay device 10 comprises a plurality of delay elements 11a, 11b, 11c, 11d and 11e, interconnected in a series circuit. Each of the delay elements delays the input signal CLKin, which is fed to the series circuit at the input terminal E10, by a delay time t. The delayed input signal can be tapped off at respective output terminals A11a, A11b, A11c, A11d and A11e of the delay elements as output signal AS1, AS2, AS3, AS4 and AS5. The output signals of the delay elements are fed to a mixer circuit 18. As a result of different output signals from among the output signals AS1 . . . AS5 being mixed, the phase-shifted signals P1 and P2 can be generated at the output terminals A10a and A10b of the delay device.

The mixer circuit 18 has a plurality of multiplexers to which in each case one of the output signals of the delay elements is fed. The output terminal A11a of the delay element 11a is connected to an input side of the multiplexer 12a. The output terminal A11e of the delay element 11e is connected to a multiplexer 12b on the input side. An output side of the multiplexer 12b is connected to the input side of the multiplexer 12a. Likewise, the multiplexers 13a, 15a and 16a are also connected on the input side in each case to an output terminal of one of the delay elements and a multiplexer output connected downstream. The output signals P1a and P1b generated by the multiplexers 12a and 13a are fed to a phase interpolator 14, which generates the phase-shifted signal P1 on the output side. The output signals P2a and P2b of the multiplexers 15a and 16a are fed to a phase interpolator 17. The phase interpolator 17 generates the phase-shifted signal P2 on the output side.

Figure 5:
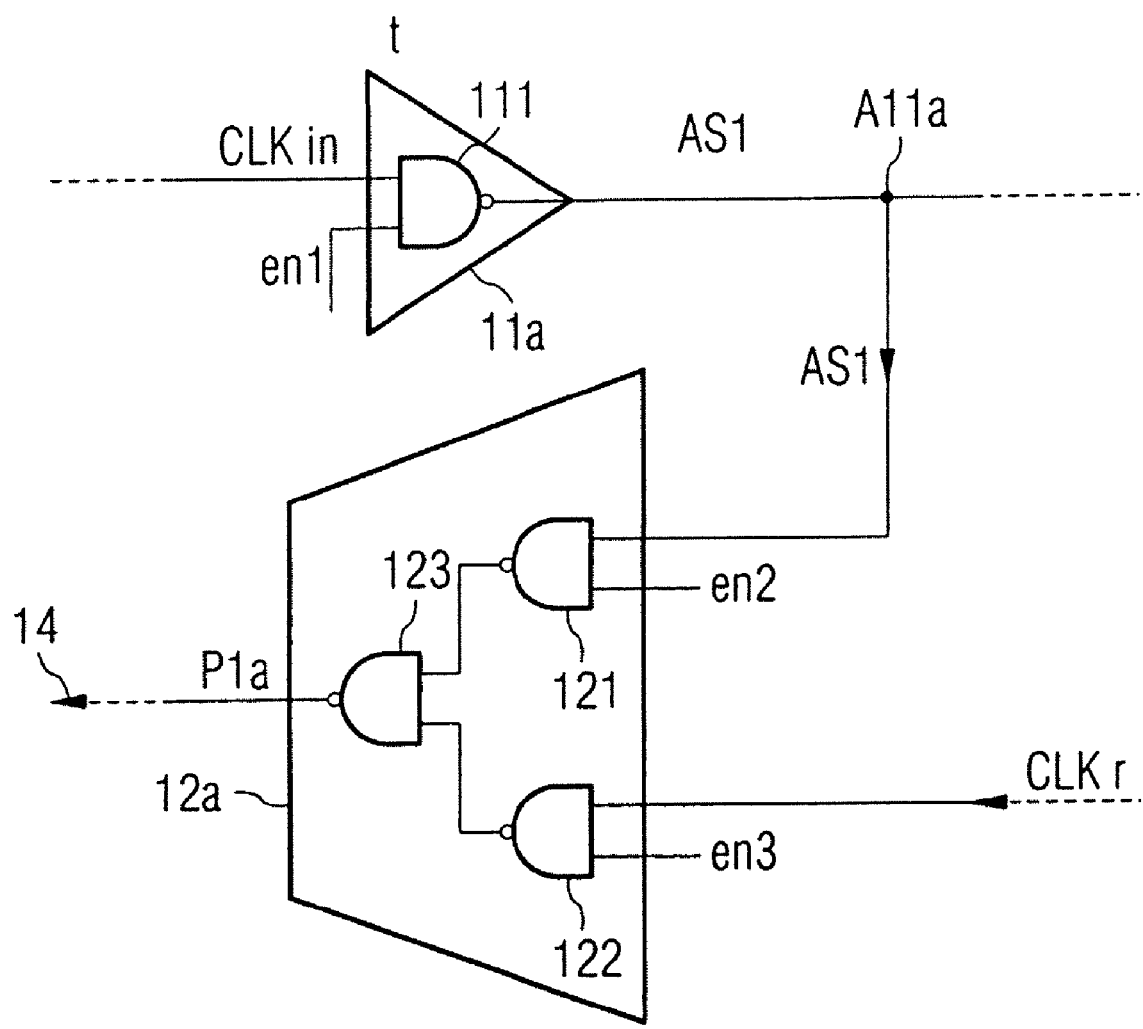
FIG. 5 illustrates an embodiment of a delay element and of a multiplexer of a delay device.

FIG. 5 shows the delay element 11a and the multiplexer 12a connected to the output terminal A11a of the delay element 11a. The delay element 11a comprises a NAND gate 111, to which are fed on the input side the input signal CLKin and an activation signal en1, via which the gate can be controlled in the conducting or blocking state. If the activation signal en1 controls the NAND gate 111 in the conducting state, the signal AS1 generated on the output side has an inverted state with respect to the input signal CLKin and is delayed by the delay time t. The output signal AS1 is fed to the multiplexer 12a via the output terminal A11a. The multiplexer 12a comprises NAND gates 121, 122 and 123. The output signal AS1 that is inverted with respect to the input signal CLKin is fed to an input side of the NAND gate 121. An output signal CLKr of the multiplexer 12b is fed to an input side of the NAND gate 122. By virtue of the NAND gates 121 and 122 being controlled in the conducting or blocking state, either the output signal AS1 of the delay element 11a or the output signal of the multiplexer 12b can be fed to the phase interpolator 14. Consequently, via the embodiment of the delay device that is illustrated in FIG. 5, the signal fed to a delay element on the input side can be generated in inverted and delayed fashion at an output terminal and be fed to a phase interpolator via a multiplexer.

The phase interpolator 14 makes it possible to mix an output signal P1a of the multiplexer 12a with an output signal P1b of the multiplexer 13a. The phase interpolator 17 makes it possible to mix an output signal P2a of the multiplexer 15a with an output signal P2b of the multiplexer 16b.

The functioning of the mixer circuit 18 will be illustrated below on the basis of an example. If the multiplexer 12a is inhibited, for example, and the multiplexer 13a is controlled in the conducting state such that it forwards the output signal AS3 that is delayed by a delay time 3*t with respect to the input signal CLKin, only the output signal AS3 is fed as signal P1a to the phase interpolator 14. Since only one signal is fed to the phase interpolator 14 on the input side, the phase interpolator generates on the output side, at the output terminal A10a of the delay device, the phase-shifted signal P1 that is delayed by the delay time 3*t with respect to the input signal CLKin. If the signal generated by the delay element 11b on the output side is coupled out at the output terminal A11b via the multiplexer 15a and fed as phase-shifted signal P2a and the signal generated by the delay element 11d on the output side is fed via the multiplexer 16a as phase-shifted signal P2b to the phase interpolator 17, the phase interpolator 17 can generate, for example, a phase-shifted signal P2 having the same time delay as the phase-shifted signal P1. Since the output signals AS1, . . . , AS5 are in each case generated in inverted fashion with respect to one another in the series circuit of the delay elements, a phase-shifted signal P1 and a phase-shifted signal P2 that is inverted with respect thereto can be generated at the same delay time via the embodiment of the delay device that is illustrated in FIG. 4.

The setting of the delay times T1 and T2 with which the delay device 10 generates the phase-shifted signals P1 and P2 is illustrated with reference to FIGS. 6A to 6C. In contrast to the embodiments of the delay device illustrated in FIGS. 2A to 2C, however, only half as many delay elements are used for the series circuit. The length of the series circuit corresponds to the region shown as not hatched in FIGS. 6A to 6C, while the hatched region is a virtual region serving only for illustrating the functioning of the circuit.

Figure 6A:
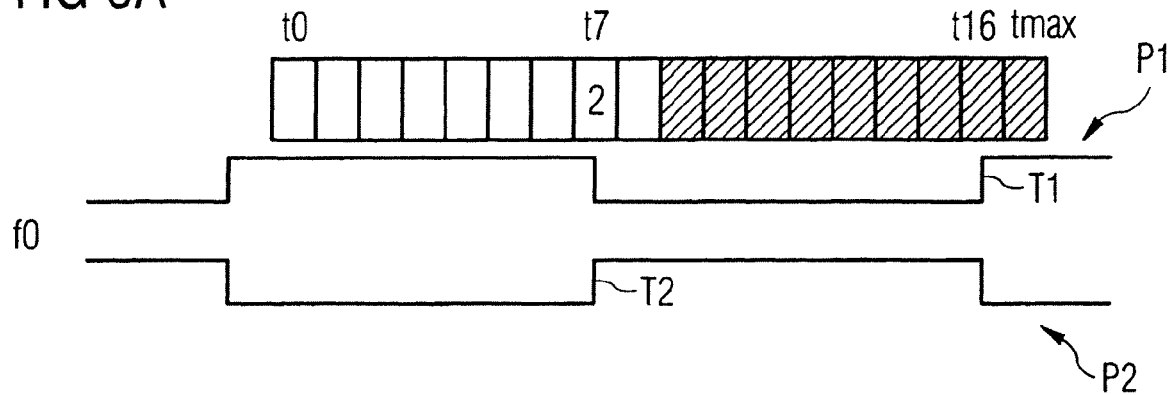
FIG. 6A illustrates an embodiment of a delay device with an output of a phase-shifted signal in the case where the delay device is driven with an input signal having a first frequency.
Figure 6B:
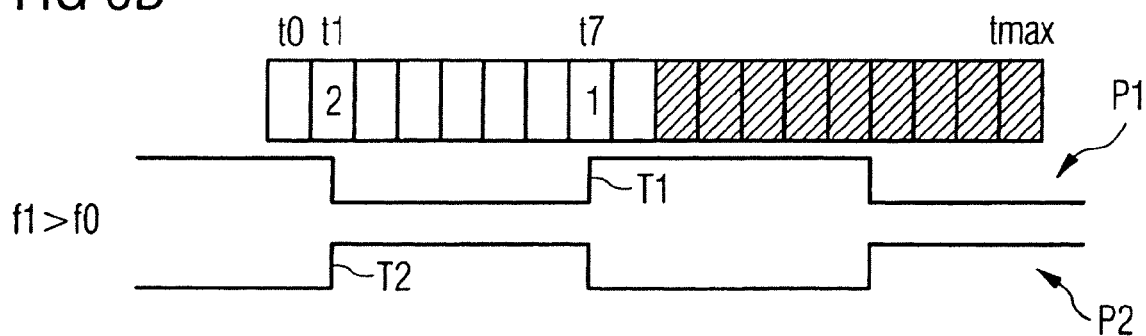
FIG. 6B shows an embodiment of a delay device with an output of a phase-shifted signal in the case where the delay device is driven with an input signal having a second frequency.
Figure 6C:
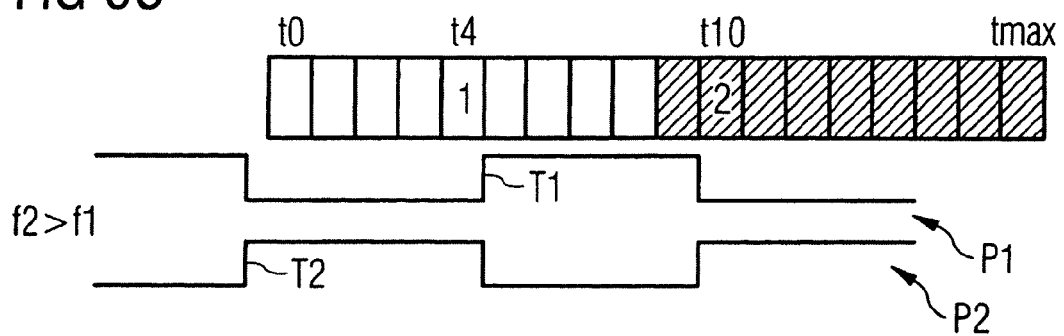
FIG. 6C illustrates an embodiment of a delay device with an output of a phase-shifted signal in the case where the delay device is driven with an input signal having a third frequency.

FIG. 6A shows the case where the delay circuit is driven with an input signal CLKin having a frequency f0 at the input terminal E100. In order to generate the output signal of the delay circuit phase-synchronously with respect to the input signal, the delay time T1 with which the phase-shifted signal P1 is generated by the delay device at the output terminal A10a would have to be set to the delay instant t16. At this delay time, the phase-shifted signal P1 has a rising edge. Since the tapping at the delay instant t16 lies in the virtual region of the delay device, however, a delay of the input signal CLKin at the delay instant t16 cannot be realized. However, the phase-shifted signal P2 at the delay time t7, at which the phase-shifted signal P1 has a falling edge, can be tapped off from the delay device likewise with a rising edge since the phase-shifted signal P2 can be generated in inverted fashion with respect to the phase-shifted signal P1 via the embodiment of the delay device illustrated in FIG. 4. The delay time T2 with which the phase-shifted signal P2 is generated at the output terminal A10b is therefore set to the delay instant t7 via the control circuit 60. The selection circuit 20 is driven by the control circuit 60 such that it generates the phase-shifted signal P2 at the output terminal A100 of the delay circuit.

If the duty cycle correction circuit 70 is connected between the selection circuit 20 and the output terminal A100 of the delay circuit, the output signal CLKout can be prevented from having an inverse duty cycle behavior relative to the input signal.

In the event of a further increase in the frequency of the input signal to a frequency f1, the delay time with which the phase-shifted signal P2 is generated is reduced further. As is illustrated with reference to FIG. 6B, the input signal CLKin can be generated synchronously with respect to the output signal CLKout if the delay time of the phase-shifted signal P2 is set to the delay instant t1. At this delay time, a rising edge of the phase-shifted signal P2 can be generated at the output terminal A10b. At the same time, via a readjustment of the delay time T1, it is also possible to generate a rising edge of the phase-shifted signal P1 in the actual region of the series circuit of the delay elements. The control circuit 60 therefore sets the delay time T1 to the delay instant t7, while the delay time T2 of the phase-shifted signal P2 is set to the delay instant t1. Both phase-shifted signals can be coupled out from the chain of the delay elements. The selection circuit 20 will generally be set such that it generates the less delayed signal P2 at the output terminal A100.

In the event of a further increase in the frequency to the frequency f2, the phase-shifted signal P2 would have to be delayed with a delay time T2 preceding the delay instant t0 of the delay device. If the delay time T2 has previously been readjusted to the delay instant t0 during the increase in the frequency, the selection circuit 20 switches the phase-shifted signal P1 to the output terminal A100. The delay time with which the phase-shifted signal P1 is generated at the output terminal A10a is set to the delay instant t4.

Figure 2A:
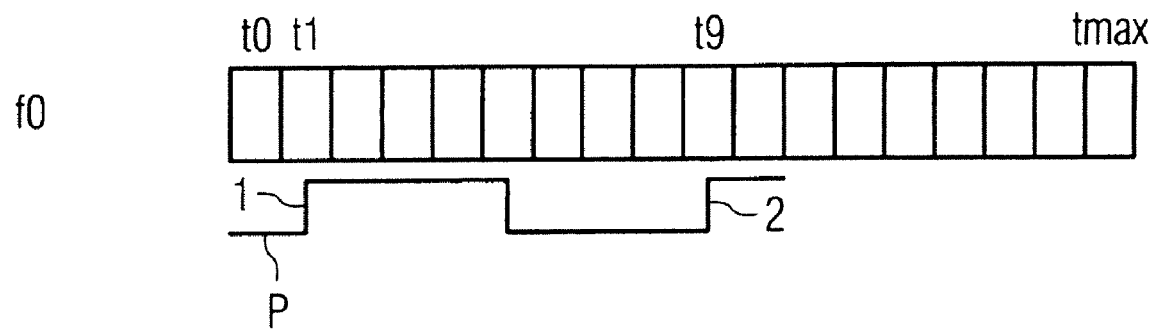
FIG. 2A illustrates an embodiment of a delay device with an output of a phase-shifted signal in the case where the delay device is driven with an input signal having a first frequency.
Figure 2B:
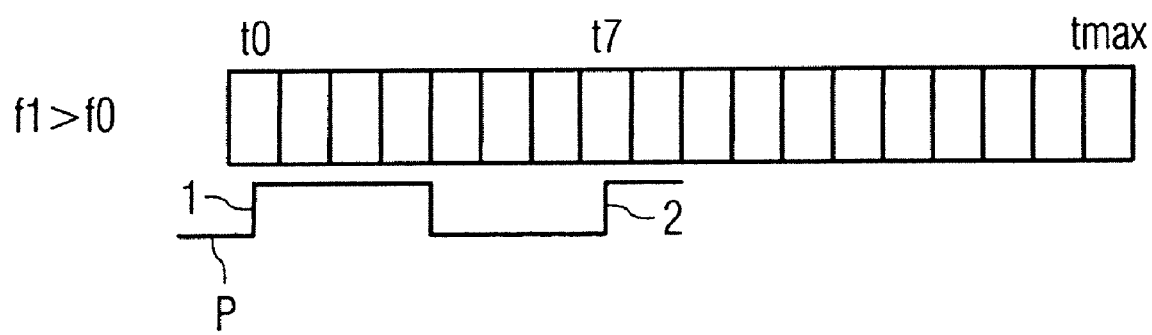
FIG. 2B illustrates an embodiment of a delay device with an output of a phase-shifted signal in the case where the delay device is driven with an input signal having a second frequency.
Figure 2C:
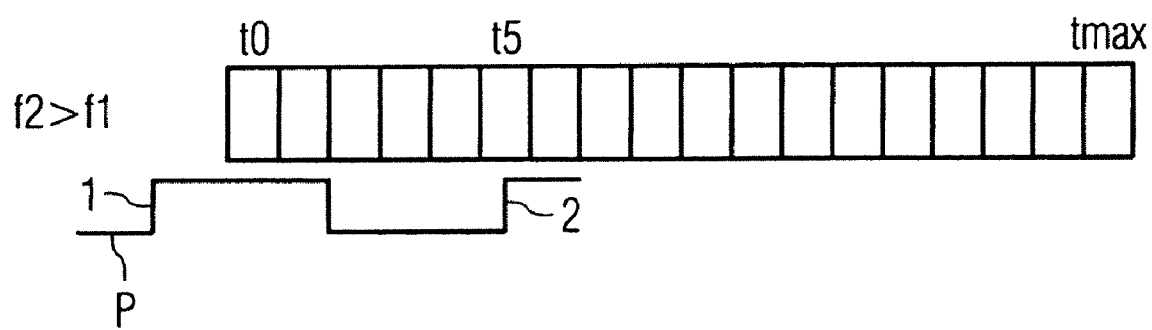
FIG. 2C illustrates an embodiment of a delay device with an output of a phase-shifted signal in the case where the delay device is driven with an input signal having a third frequency.

Since the signals P1 and P2 can be generated in inverted fashion with respect to one another at identical delay times via the delay device 10, it suffices if a length of the chain of the delay elements is designed such that the delay that is maximally to be achieved corresponds to half of the period duration of the input signal having the lowest specified frequency. Consequently, the embodiment of the delay device illustrated in FIG. 4 makes it possible to reduce the number of delay elements by half in comparison with the embodiment of the delay device that is illustrated in FIGS. 2A to 2C. Whereas in the embodiment of the delay device in FIGS. 2A to 2C the maximum possible delay time of the chain comprising the delay elements had to correspond to a period duration of the lowest specified frequency of the input signal, the chain comprising the delay elements in accordance with FIG. 4 and FIGS. 6A to 6C is designed to be only half as long. The series circuit comprising the delay elements has to be designed such that the maximum achievable delay time corresponds to half of the period duration of the input signal having the lowest specified frequency.

Figure 7:
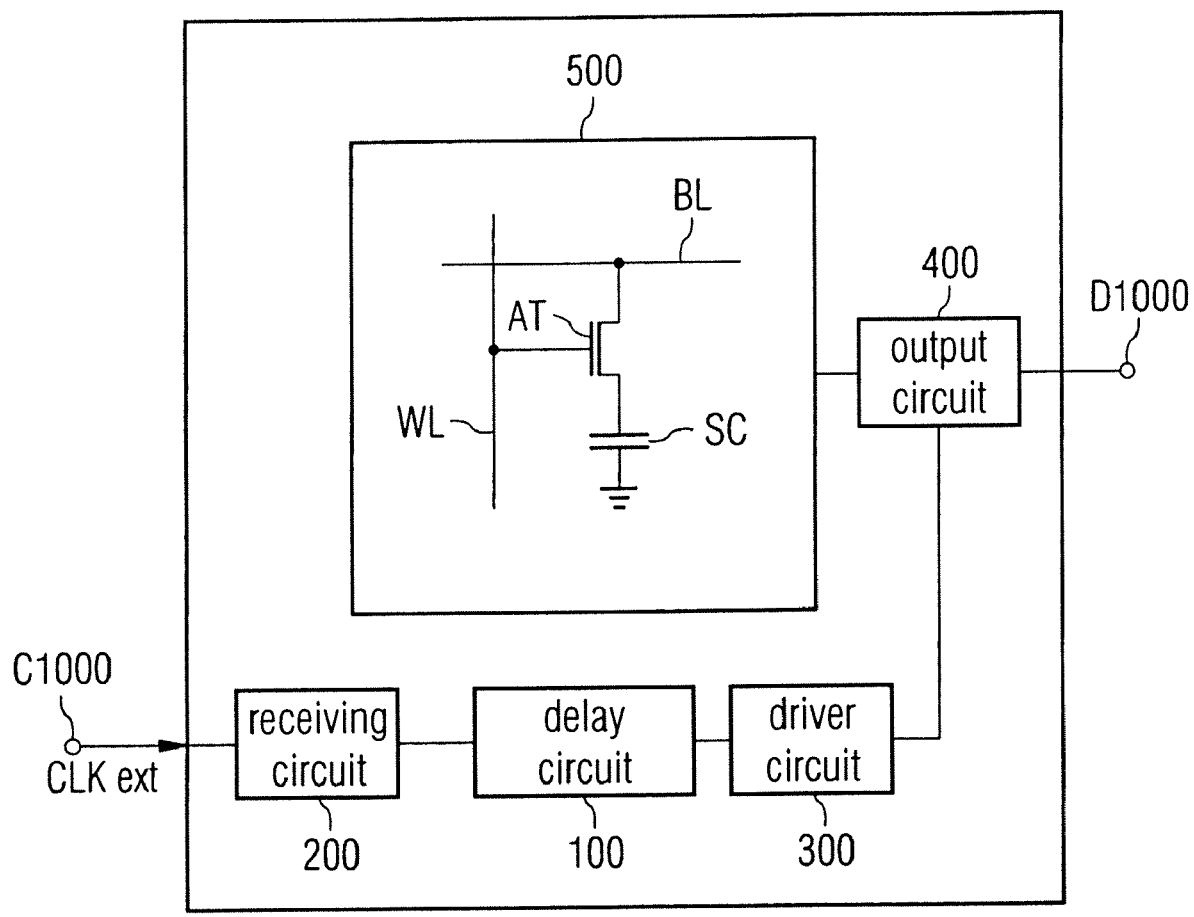
FIG. 7 illustrates an embodiment of an integrated semiconductor memory comprising a delay circuit configured to synchronize a control clock signal with an input clock signal.

FIG. 7 shows an application of the delay circuit 100 in an integrated circuit memory 1000. The integrated circuit memory comprises a memory cell array 500, in which for example DRAM (Dynamic Random Access Memory) memory cells are arranged along word lines WL and bit lines BL. In the event of a read access, a memory cell is selected via an address supplied to the integrated semiconductor memory and the data stored in the memory cell are fed to an output circuit 400 and buffer-stored there. For outputting the buffer-stored data, the output circuit 400 is driven by a control clock signal CLKout. The control clock signal CLKout is derived from an external clock signal CLKext applied to an external clock terminal C1000.

For this purpose, the external clock signal CLKext is amplified in a receiving circuit 200 and fed to the delay circuit 100. The delay circuit generates one of the phase-shifted signals P1 and P2, which is fed to a driver circuit 300 for generating the control clock signal CLKout. If the delay circuit 100 is locked, the control clock signal CLKout is generated phase-synchronously with respect to the external clock signal CLKext, such that the data output by the output circuit 400 at a data terminal D1000 are output synchronously with the external clock signal CLKext.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A delay circuit, comprising:
    a controllable delay device configured to generate first and second signals that are phase-shifted with respect to an input signal of the delay device such that at respective first and second output terminals of the controllable delay device, after a delay of the input signal by a delay time, the second phase-shifted signal is an inverted version of the first phase-shifted signal, wherein the controllable delay device comprises:
        a series circuit of delay elements configured to receive the input signal, wherein each of the delay elements is configured to generate an output signal that is delayed with respect to the input signal by a respective delay time; and
        a mixer circuit configured to generate the first and second phase-shifted signals, the second phase-shifted signal being the inverted version of the first phase-shifted signal, via the respective output signals of the delay elements;
    a feedback circuit configured to generate a feedback signal that is phase-shifted with respect to one of the first or second phase-shifted signals selectively supplied to the feedback circuit;
    a first phase comparison device configured to perform a phase comparison of the input signal of the delay device and the feedback signal; and
    a control circuit configured to set first and second delay times by which the controllable delay device respectively delays the first and second phase-shifted signals, the first and second delay times depending on the phase comparison performed by the first phase comparison device.

2. The delay circuit of claim 1, wherein the delay elements are configured to invert a respectively received signal to generate an output signal.

3. The delay circuit of claim 1, wherein:
    output terminals of first delay elements from among the delay elements are connectable to a first output terminal of the controllable delay device;
    output terminals of second delay elements from among the delay elements are connectable to a second output terminal of the controllable delay device; and
    each one of the first delay elements is cascade-connected with a respective one of the second delay elements in the series circuit.

4. The delay circuit of claim 3, further comprising:
    a first phase interpolator configured to generate the first phase-shifted signal from the output signals of at least two of the first delay elements; and
    a second phase interpolator configured to generate the second phase-shifted signal from the output signals of at least two of the second delay elements.

5. The delay circuit of claim 4, further comprising:
a plurality of multiplexers, each multiplexer being configured to receive an output of one of the delay elements and an output of another one of the multiplexers;
wherein an output of at least one of the multiplexers is coupled to the first or second phase interpolator.

6. The delay circuit of claim 1, wherein each of the delay elements comprises an inverter circuit.

7. The delay circuit of claim 1, wherein the number of delay elements of the series circuit is such that a delay time with which an output signal can be generated at a last one of the delay elements arranged in the series circuit corresponds to half of the period duration of a frequency of the input signal.

8. The delay circuit of claim 1, further comprising:
a selection circuit configured to select the first or second phase-shifted signal to be supplied to the feedback circuit.

9. The delay circuit of claim 8, further comprising:
a second phase comparison device configured to generate a second comparison signal in response to receiving the first and second phase-shifted signals, the second comparison signal depending on a phase comparison between the phase of the first phase-shifted signal and the phase of the second phase-shifted signal;
wherein the control circuit is configured to receive the second comparison signal and further configured to set the first delay time depending on the second comparison signal, if the selection circuit selects the second phase-shifted signal and set the second delay time depending on the second comparison signal, if the selection circuit selects the first phase-shifted signal.

10. The delay circuit of claim 8, further comprising:
a duty cycle correction circuit configured to correct a duration of a first and second level of the first or second phase-shifted signal, the duty cycle correction circuit being arranged between the selection circuit and an output of the delay circuit.

11. The delay circuit of claim 1, wherein:
the first phase comparison device is configured to generate a first comparison signal depending on a phase comparison between a phase of the input signal and of the feedback signal; and
the control circuit is configured to receive the first comparison signal and further configured to set a first delay time between the input signal and the first phase-shifted signal and set a second delay time between the input signal and the second phase-shifted signal, depending on the first comparison signal.

12. An integrated circuit memory comprising:
the delay circuit according to claim 1; and
a receiver circuit configured to generate the input signal of the delay circuit in response to receiving an external clock signal.

13. The integrated circuit memory of claim 12, further comprising:
a driver circuit configured to generate a control clock signal in response to receiving the first or second phase-shifted signal from the delay circuit; and
an output circuit configured to output data stored in the integrated circuit memory in response to receiving the control clock signal.

* * * * *